United States Patent
Satake et al.

(10) Patent No.: US 7,831,953 B2
(45) Date of Patent: Nov. 9, 2010

(54) LITHOGRAPHY SIMULATION METHOD, PROGRAM AND SEMICONDUCTOR DEVICE MANUFACTURING METHOD

(75) Inventors: Masaki Satake, Yokohama (JP); Hiromitsu Mashita, Kawasaki (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 11/802,615

(22) Filed: May 24, 2007

(65) Prior Publication Data

US 2007/0277146 A1    Nov. 29, 2007

(30) Foreign Application Priority Data

May 26, 2006    (JP) .............................. 2006-146480

(51) Int. Cl.
    *G06F 17/50* (2006.01)
(52) U.S. Cl. .......................................... 716/19; 716/21
(58) Field of Classification Search ............. 716/19–21; 430/5, 22, 30
    See application file for complete search history.

(56) References Cited

U.S. PATENT DOCUMENTS

| | | | |
|---|---|---|---|
| 6,553,562 B2* | 4/2003 | Capodieci et al. | 716/19 |
| 7,093,229 B2* | 8/2006 | Pang et al. | 716/21 |
| 7,266,803 B2* | 9/2007 | Chou et al. | 716/21 |
| 2004/0115541 A1* | 6/2004 | Yamaguchi et al. | 430/30 |
| 2006/0078805 A1* | 4/2006 | Hansen | 430/5 |
| 2006/0129967 A1 | 6/2006 | Tanaka et al. | |

OTHER PUBLICATIONS

V. Ivin et al., "Fast Modeling of 3D Planar Resist Images for High NA Projection Lithography," SPIE vol. 3051, pp. 567-577.

* cited by examiner

*Primary Examiner*—Jack Chiang
*Assistant Examiner*—Binh C Tat
(74) *Attorney, Agent, or Firm*—Finnegan, Henderson, Farabow, Garrett & Dunner, L.L.P.

(57) ABSTRACT

A lithography simulation method which predicts the result that a pattern formed on a mask is transferred onto a sample by use of a simulation based on pattern data of the mask includes subjecting a mask layout containing a pattern whose periodicity is disturbed to the simulation. At this time, a calculation area of pattern data used for the simulation is set to an integral multiple of minimum periodic length of the mask layout.

11 Claims, 4 Drawing Sheets

LITHOGRAPHY SIMULATION METHOD, PROGRAM AND SEMICONDUCTOR DEVICE MANUFACTURING METHOD

CROSS-REFERENCE TO RELATED APPLICATIONS

This application is based upon and claims the benefit of priority from prior Japanese Patent Application No. 2006-146480, filed May 26, 2006, the entire contents of which are incorporated herein by reference.

BACKGROUND OF THE INVENTION

1. Field of the Invention

The present invention relates to a lithography simulation method and the like.

2. Description of the Related Art

Recently, the integration density of an LSI is rapidly enhanced and the role of a lithography simulation for pattern verification, pattern correction and the like becomes more important. For example, when a device pattern is given, the exposure condition or mask CD is generally optimized. However, there occurs a problem that the cost becomes excessively high when optimization is attained based on the conventional experimental base. Therefore, it is proposed that the exposure condition or mask CD is optimized by use of a lithography simulation. In this case, the precision and operation speed of the lithography simulation are important.

In order to do the lithography simulation for pattern verification with high precision, it is necessary to set a wide area as an object to be calculated with a certain target point on a pattern set as a center. However, if the wide area is set as the object to be calculated, the calculation time becomes excessively long. Therefore, in the actual lithography simulation, a calculation area is determined by comparing calculation times and precisions (for example, refer to SPIE vol. 3051 pp 567 to 577).

However, the calculation area must be made larger as the integration density of the recent LSI is further enhanced. As a result, there occurs a problem that the calculation time for the lithography simulation is increased.

Thus, in the lithography simulation, the precise pattern verification can be attained when the calculation area is made larger, but the processing time is increased. On the other hand, if the calculation area is made small, the processing time can be reduced, but it becomes difficult to attain the precise pattern verification. That is, in the lithography simulation, the trade-off relation is set between the calculation area and the degree of precision of the pattern verification in the lithography simulation.

BRIEF SUMMARY OF THE INVENTION

According to a first aspect of the present invention, there is provided a lithography simulation method which predicts the result that a pattern formed on a mask is transferred onto a sample by use of a simulation based on pattern data of the mask, comprising setting a calculation area of pattern data used for the simulation to an integral multiple of minimum periodic length of a mask layout when the mask layout containing a pattern whose periodicity is disturbed is subjected to the simulation.

According to a second aspect of the present invention, there is provided a semiconductor device manufacturing method comprising, producing a photomask based on a lithography simulation result obtained by the method according to the above lithography simulation method and transferring a pattern formed on the photomask to a sample.

According to a third aspect of the present invention, there is provided a computer readable storage medium storing instructions of a computer program which causes the computer to execute a method for predicting the result that a pattern formed on a mask is transferred onto a sample by use of a simulation and which when executed by a computer results in performance of steps, comprising acquiring minimum periodic length of a mask layout, setting a calculation area of pattern data used for the simulation to an integral multiple of the acquired minimum periodic length of the mask layout, and subjecting the mask layout containing a pattern whose periodicity is disturbed to the simulation by use of the thus set calculation area.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
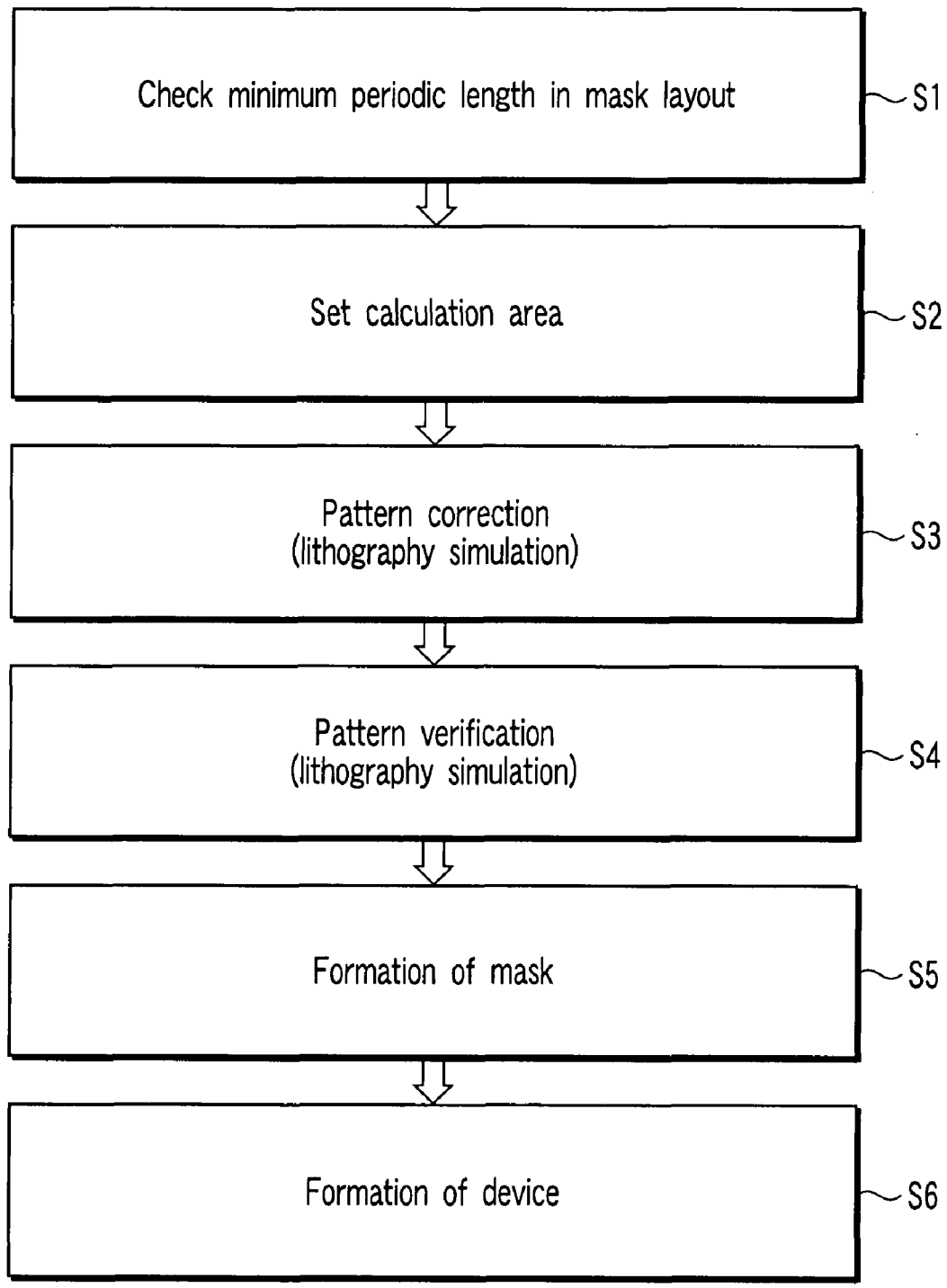
FIG. 1 is a flowchart for illustrating a lithography simulation method according to a first embodiment of this invention by taking a manufacturing method of a semiconductor device as an example.

FIG. 1 is a flowchart for illustrating a manufacturing method of a semiconductor device using a lithography simulation method according to a first embodiment of this invention.

First, the minimum periodic length of a mask layout (the pitch of the mask pattern) is checked based on pattern data of a mask used for pattern exposure (step S1). In this case, it is supposed that the mask pattern data contains a mask layout whose periodicity is disturbed.

Then, a calculation area used for the lithography simulation is set (step S2). At this time, the calculation area is set to an integral multiple of the minimum periodic length of the mask layout. In this case, it is desirable to set a calculation area A determined as an integral multiple of the minimum periodic length of the mask layout smaller than a calculation area B using a distance considered to be optically independent from a calculation portion as a radius. More specifically, the calculation area B using the distance considered to be optically independent from the calculation portion as the radius is set as the minimum calculation area which satisfies the condition that a calculation error is smaller than an error permitted for the simulation calculation. Then, the calculation area A is set to an area which is smaller than the calculation area B.

Thus, an attempt is made to reduce the calculation area so as to shorten the calculation time. In this case, a simulation error is generated by setting the calculation area A for the lithography simulation smaller than the general calculation area B. In the present embodiment, occurrence of the simulation error is prevented by use of a method which will be described later.

Next, a pattern correction process (OPC: Optical Proximity Correction) is performed by the lithography simulation to correct the mask pattern by taking the optical proximity effect into consideration (step S3). In the lithography simulation, the calculation area A set in the step S2 is used.

Next, a pattern verification operation is performed (step S4). That is, the lithography simulation is performed by use of the mask pattern corrected in the step S3 and whether or not a product can be finished with the desired size on a wafer is verified. Also, in the above lithography simulation, the calculation area A set in the step S2 is used.

In this case, if the mask pattern is not finished according to the desired size on the wafer, the exposure condition and/or mask CD is changed. Specifically, the exposure condition and/or mask CD is changed and then the pattern correction process (step S3) and pattern verification process are performed again (step S4).

If the mask pattern is finished according to the desired size on the wafer, a photomask is formed based on the pattern data (step S5). That is, a photomask is formed by use of the pattern data of the mask corrected in the step S3 and verified in the step S4.

Next, the pattern on the mask is transferred onto a wafer by use of the photomask formed in the step S5 by a projection/exposure equipment. Thus, a device pattern is formed on the wafer (step S6).

The inventors of this application checked the relation between the calculation area and the actually formed pattern size for various pattern sizes.

Figure 2:
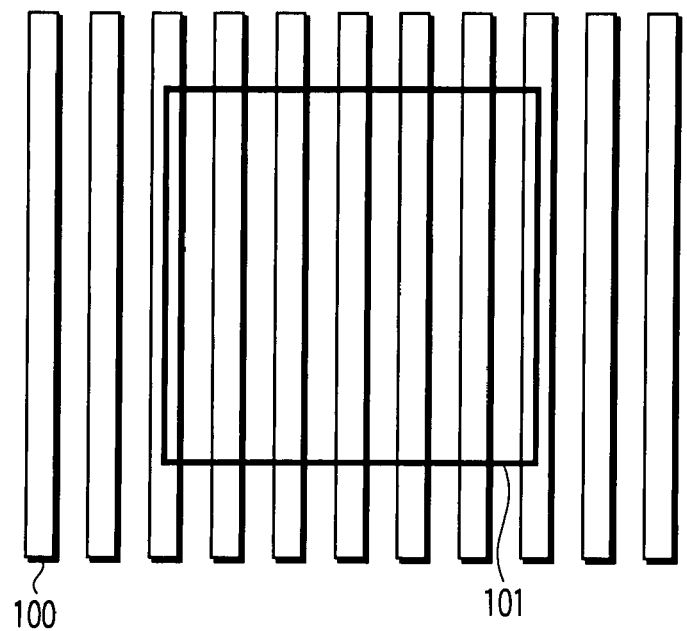
FIG. 2 is a view showing a case wherein a calculation area is set to an integral multiple of a pitch of a mask pattern, for illustrating the calculation area when a line & space pattern is used.
Figure 3:
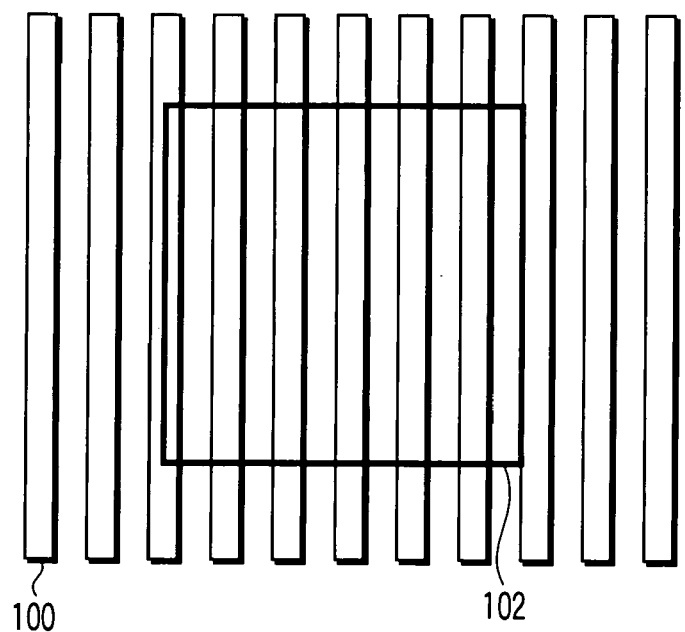
FIG. 3 is a view showing a case wherein a calculation area is set to an integral multiple of a pitch of a mask pattern+pitch/4, for illustrating the calculation area when a line & space pattern is used.
Figure 4:
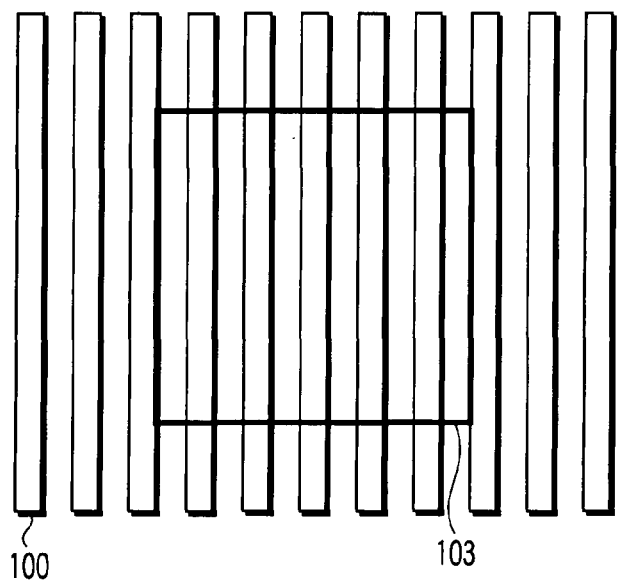
FIG. 4 is a view showing a case wherein a calculation area is set to an integral multiple of a pitch of a mask pattern+pitch/2, for illustrating the calculation area when a line & space pattern is used.

FIGS. 2 to 4 are views each for illustrating a calculation area when a mask pattern (line & space pattern) 100 formed of lines and spaces is used. FIG. 2 is a conceptual view showing a case wherein a calculation area 101 is set to an integral multiple of a pitch of the mask pattern 100. FIG. 3 is a conceptual view showing a case wherein a calculation area 102 is set to an integral multiple of the pitch of the mask pattern 100+pitch/4. FIG. 4 is a conceptual view showing a case wherein a calculation area 103 is set to an integral multiple of the pitch of the mask pattern 100+pitch/2.

Figure 5:
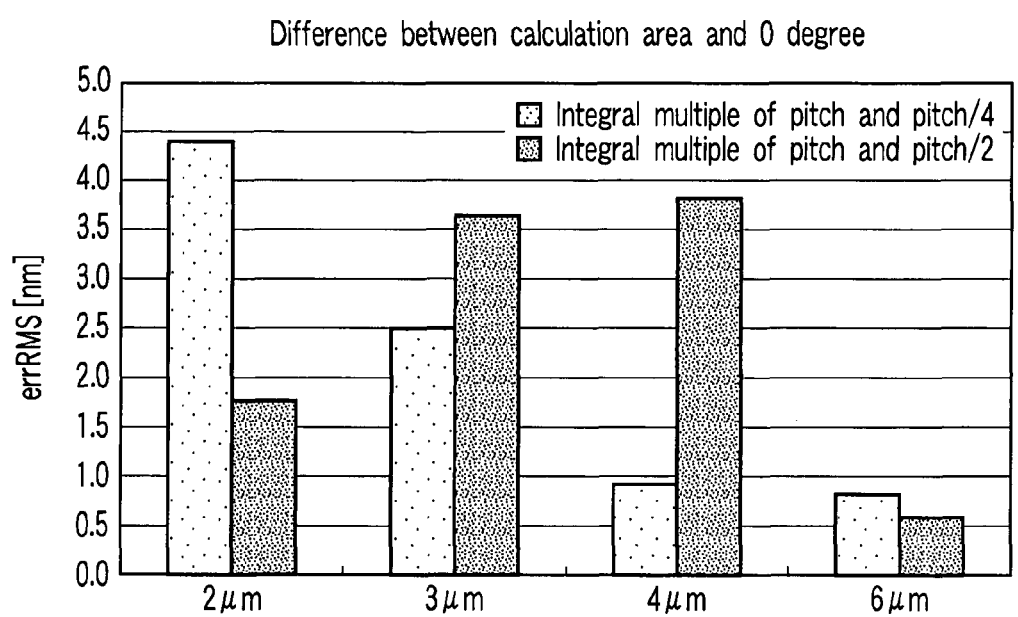
FIG. 5 is a diagram showing RMS of a difference between the line width when the calculation area is set to an integral multiple of the pitch of the mask pattern and the line width when the calculation area is set to an integral multiple of the pitch of the mask pattern+pitch/4 and RMS of a difference between the line width when the calculation area is set to an integral multiple of the pitch of the mask pattern and the line width when the calculation area is set to an integral multiple of the pitch of the mask pattern+pitch/2.

FIG. 5 shows simulation errors when the line widths calculated by setting the calculation area to approximately 2 µm, 3 µm, 4 µm, 6 µm are set as a reference. In either case, RMSs of differences between the line widths when the calculation area is set to integral multiples of the pitch of the mask pattern (respectively set to 18 times the pitch, 27 times the pitch, 36 times the pitch, 54 times the pitch) and the line widths when the calculation area is set to integral multiples of the pitch of the mask pattern+pitch/4 (respectively set to 18.25 times the pitch, 27.25 times the pitch, 36.25 times the pitch, 54.25 times the pitch) and RMSs of differences between the line widths when the calculation area is set to integral multiples of the pitch of the mask pattern and the line widths when the calculation area is set to integral multiples of the pitch of the mask pattern+pitch/2 (respectively set to 18.5 times the pitch, 27.5 times the pitch, 36.5 times the pitch, 54.5 times the pitch).

It is understood from FIG. 5 that RMSs obtained at the time of "integral multiple of pitch+pitch/4" and "integral multiple of pitch+pitch/2" are larger in the cases wherein the calculation area is set to approximately 2 µm, 3 µm, 4 µm. Further, it is understood that RMS is small in each case when the calculation area is set to approximately 6 µm.

When the line width is greatly changed by setting the calculation area to an integral multiple of the pitch, an integral multiple of the pitch+pitch/4 and an integral multiple of the pitch+pitch/2, the line width will be greatly changed due to a minute difference in the size of the calculation area. This indicates that the calculation area is too small to subject a mask pattern to the lithography simulation with high precision in the above optical condition. That is, in the case of the above optical condition and mask pattern, it is understood from FIG. 5 that a calculation area of approximately 6 µm or more in which the line width is substantially kept unchanged due to a minute difference in the calculation area is required.

Figure 6:
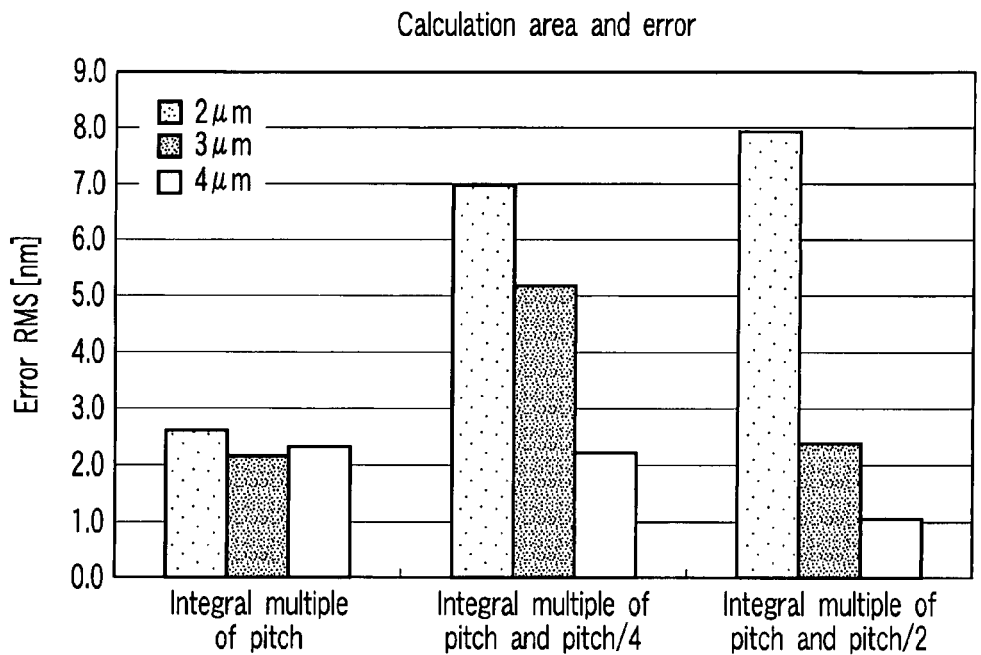
FIG. 6 is a diagram showing RMS of a difference between the line width when the calculation area is set to 6 µm and the line width when the calculation area is set to an integral multiple of the pitch of the mask pattern, RMS of a difference between the line width when the calculation area is set to 6 µm and the line width when the calculation area is set to an integral multiple of the pitch of the mask pattern+pitch/4 and RMS of a difference between the line width when the calculation area is set to 6 µm and the line width when the calculation area is set to an integral multiple of the pitch of the mask pattern+pitch/2.

RMSs obtained when the calculation area is set to approximately 2 µm, 3 µm, 4 µm while the line width calculated with the calculation area set to approximately 6 µm is used as a reference are shown in FIG. 6.

"Integral multiple of pitch" in FIG. 6 indicates RMSs of differences between the line width calculated with the calculation area set to approximately 6 µm and the line widths obtained when the calculation area is set to integral multiples of a pitch of the mask pattern (18 times the pitch, 27 times the pitch, 36 times the pitch). Further, "integral multiple of pitch+pitch/4" indicates RMSs of differences between the line width calculated with the calculation area set to approximately 6 µm and the line widths obtained when the calculation area is set to integral multiples of the pitch+pitch/4 (18.25 times the pitch, 27.25 times the pitch, 36.25 times the pitch). In addition, "integral multiple of pitch+pitch/2" indicates RMSs of differences between the line width calculated with the calculation area set to approximately 6 µm and the line widths obtained when the calculation area is set to integral multiples of the pitch+pitch/2 (18.5 times the pitch, 27.5 times the pitch, 36.5 times the pitch).

If the calculation area is set to an integral multiple of the pitch and when the calculation area is set to approximately 2 µm, 3 µm, 4 µm, RMSs are set small. On the other hand, if the calculation area is set to an integral multiple of the pitch+pitch/4, RMSs obtained when the calculation area is set to approximately 2 µm, 3 µm are set large. Further, if the calculation area is set to an integral multiple of the pitch+pitch/2, RMS obtained when the calculation area is set to approximately 2 µm is set large.

For example, as shown in FIG. 6, when the calculation area is set to approximately 2 µm, 3 µm, 4 µm, a difference in the line width with respect to the line width obtained when the calculation area is set to approximately 6 µm is kept substantially unchanged. That is, a difference between the line width obtained when the calculation area is set to the integral multiple of the pitch of the main pattern of the mask and the line width obtained when the calculation area is set to approximately 6 µm is small.

Therefore, when the calculation area of the lithography simulation is set to an integral multiple of the minimum periodic length of the mask layout, the lithography simulation can be performed with substantially the same precision as that when a large calculation area of approximately 6 µm is used even if a small calculation area of approximately 2 µm is used. This indicates that the lithography simulation can be performed with respect to a small calculation area of approximately 2 µm without using a large calculation area of approximately 6 µm and calculation time can be reduced. That is, both of a reduction in the calculation time and high precision of the pattern verification can be attained.

Based on the above information, verification of a mask pattern, formation of a mask and formation of a device are performed as follows according to the flowchart of FIG. 1.

Figure 7:
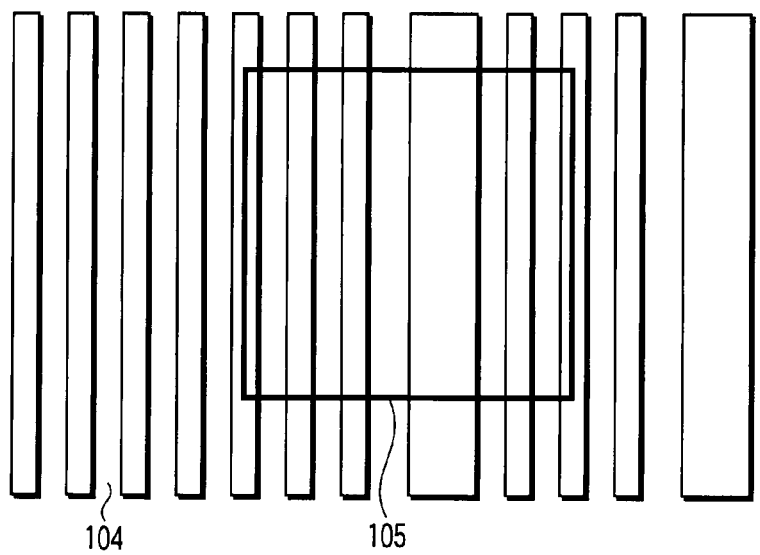
FIG. 7 is a view showing one example of the mask layout containing a pattern whose periodicity is disturbed in the present embodiment of this invention.

FIG. 7 is a conceptual view showing a pattern containing lines of 60 nm and spaces (1:1) as a main pattern and partly including lines of 200 nm and spaces. In FIG. 7, a reference symbol 104 indicates a line & space pattern (mask layout) containing a pattern whose periodicity is disturbed. After this, an embodiment in which a partial area of the pattern is set as a calculation area 105 and a two-eyed illumination unit with small σ is used for illumination is explained.

First, in the process of the steps S1, S2, the calculation area 105 for the lithography simulation is set to an integral multiple of the minimum periodic length of the mask layout.

Then, in the step S3, the calculation area 105 is subjected to a pattern correction process by the lithography simulation to correct a mask pattern by taking an optical proximity effect into consideration. Further, in the step S4, a pattern verification process is performed by the lithography simulation.

In the light intensity distribution simulation obtained at this time, a partial coherent image forming equation given by the following equations (1) and (2) is generally used.

$$I(x, y) = \int\int\int\int S(f, g) P(f+f_1, g+g_1) P^*(f+f_2, g+g_2) \quad (1)$$
$$\hat{m}(f_1, g_1)\hat{m}^*(f_2, g_2) \cdot \exp(-2\pi i((f_1-f_2)x + (g_1-g_2)y))$$
$$df_1 dg_1 df_2 dg_2 df dg$$
$$= \int S(f, g)\left|\int P(f+f_1, g+g_1)\hat{m}(f_1, g_1)\exp\right.$$
$$\left.(-2\pi i(f_1 x + g_1 y))df_1 dg_1\right|^2 df dg$$

$$I(x, y) = \quad (2)$$
$$\int\left(\int\int TCC(f+f_1, g+g_1; f_1, g_1)\hat{m}(f+f_1, g+g_1)\hat{m}^*(f_1, g_1)\right.$$
$$\left. df_1 dg_1\right)\exp(-2\pi i(fx+gy))df dg$$

In the equations (1) and (2), S indicates the intensity distribution of an effective light source, P indicates a pupil function of the optical projection system, * indicates a complex conjugate, $\hat{m}$ indicates a Fourier transform of complex transmittance distribution of the mask pattern, TCC indicates a transfer function called a transmission cross coefficient and I indicates light intensity distribution calculated by use of a mask thin film approximation model.

It is recognized that a pattern on a sample obtained by the lithography simulation precisely reflects pattern data of the mask.

Then, an exposure mask is formed in the step S5 based on pattern data of the mask which is verified to be finished by the lithography simulation.

Specifically, for example, the pattern data of the mask is drawn on a mask substrate having a light shielding film such as Cr (chrome) formed on a transparent substrate such as quartz by use of an mask writer or the like. Thus, the exposure mask is formed.

Next, the mask pattern is transferred onto a wafer by the photolithography by use of the exposure mask obtained in the step S5. Specifically, the mask pattern is transferred onto resist on the wafer by use of a projection/exposure equipment in the step S6 and then subjected to a developing process to form a resist pattern. Thus, the pattern finally formed on the wafer coincides to a greater extent with a pattern which should be originally formed.

As described above, in the present embodiment, the calculation area of the pattern data is set to an integral multiple of the minimum periodic length of the mask layout when the lithography simulation of the mask layout containing a pattern whose periodicity is disturbed is performed. As a result, it becomes possible to precisely verify (predict) the transferred pattern even if the calculation area is made narrower. Therefore, both of a reduction in the calculation time for lithography simulation and high precision of the pattern verification can be attained. Thus, a pattern can be precisely formed on the wafer by forming a mask based on pattern data which is verified to permit formation of a pattern with high precision and transferring the pattern of the mask onto the wafer.

[Modification]

This invention is not limited to the above embodiments. For example, this invention is not limited to the lithography simulation for pattern verification and can be applied to a lithography simulation for pattern correction such as OPC. Further, this invention can be applied to a pattern correction process of correcting a mask pattern according to the result of pattern verification. Likewise, this invention can similarly be applied to a photomask manufacturing process based on a corrected mask pattern and a semiconductor device manufacturing process by transferring a pattern formed on the photomask to a sample such as a semiconductor wafer.

The methods described in the above embodiments can also be used as a program which can be executed by a computer. For example, the program can be utilized in various equipments by previously writing the program into a recording medium such as a magnetic disc (floppy® disc, hard disc or the like), optical disk (CD-ROM, DVD or the like), or semiconductor memory. Further, the program can be transmitted to various equipments via communication media and utilized in the various equipments.

In the above embodiments, in the calculation by simulation, the mask function and pupil function or the mask function and transmission cross coefficient are multiplied by the frequency space. However, this invention can be applied to other simulation calculations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a computer to modify a mask layout, the method including using a lithography simulation method which predicts a result that a pattern formed on a mask is transferred onto a sample by use of a simulation based on pattern data of the mask, comprising:

acquiring, using the computer, a minimum periodic length of the mask layout, the periodic length being a length of a pattern included in the mask layout and a length of a space between the pattern and another adjacent pattern;

setting a distance from end to end of a calculation portion of the pattern data used for the simulation in a periodic direction of the pattern data to an integral multiple of the acquired minimum periodic length of the mask layout; and subjecting the mask layout containing a pattern whose periodicity is disturbed to the simulation by use of the thus set calculation area wherein the subjecting the mask layout containing the pattern whose periodicity is disturbed to the simulation includes correcting the pattern by taking an optical proximity effect into consideration, and verifying whether the corrected pattern is finished with desired size on a sample, and the correcting the pattern and the verifying are performed again after at least one of an exposure condition and a mask CD is changed when the corrected pattern is not finished with the desired size on the sample.

2. The lithography simulation method according to claim 1, wherein the calculation area is set smaller than a calculation area using a distance considered to be optically independent from a calculation portion as a radius.

3. The lithography simulation method according to claim 2, wherein the calculation area using the distance is set as a minimum calculation area to satisfy that a calculation error is smaller than an error permitted in the simulation calculation.

4. A semiconductor device manufacturing method comprising:

producing a photomask based on a lithography simulation result obtained by the method according to claim 1; and transferring a pattern formed on the photomask to a sample.

5. The semiconductor device manufacturing method according to claim 4, wherein the calculation area is set smaller than a calculation area using a distance considered to be optically independent from a calculation portion as a radius.

6. The semiconductor device manufacturing method according to claim 5, wherein the calculation area using the distance is set as a minimum calculation area to satisfy that a calculation error is smaller than an error permitted in the simulation calculation.

7. A computer readable storage medium storing instructions of a computer program which causes the computer to perform a method for predicting a result that a pattern formed on a mask is transferred onto a sample by use of a simulation and which when executed by a computer results in performance of steps, comprising:

acquiring a minimum periodic length of a mask layout, the periodic length being a length of a pattern included in the mask layout and a length of a space between the pattern and another adjacent pattern;

setting a distance from end to end of a calculation portion of pattern data used for the simulation in a periodic direction to an integral multiple of the acquired minimum periodic length of the mask layout; and subjecting the mask layout containing a pattern whose periodicity is disturbed to the simulation by use of the thus set calculation area wherein the subjecting the mask layout containing the pattern whose periodicity is disturbed to the simulation includes correcting the pattern by taking an optical proximity effect into consideration, and verifying whether the corrected pattern is finished with desired size on a sample, and the correcting the pattern and the verifying are performed again after at least one of an exposure condition and a mask CD is changed when the corrected pattern is not finished with the desired size on the sample.

8. The program according to claim 7, wherein the program is utilized in a device via a storage medium.

9. The program according to claim 7, wherein the program is transferred to a device via a communication medium.

10. The program according to claim 7, wherein the calculation area is set smaller than a calculation area using a distance considered to be optically independent from a calculation portion as a radius.

11. The program according to claim 10, wherein the calculation area using the distance is set as a minimum calculation area to satisfy that a calculation error is smaller than an error permitted in the simulation calculation.

* * * * *

UNITED STATES PATENT AND TRADEMARK OFFICE
CERTIFICATE OF CORRECTION

PATENT NO.       : 7,831,953 B2                                    Page 1 of 1
APPLICATION NO.  : 11/802615
DATED            : November 9, 2010
INVENTOR(S)      : Satake et al.

It is certified that error appears in the above-identified patent and that said Letters Patent is hereby corrected as shown below:

Claim 1, column 7, line 35, change "area" to --area,--.

Claim 7, column 8, line 31, change "area" to --area,--.

Signed and Sealed this
Twenty-fifth Day of January, 2011

David J. Kappos
*Director of the United States Patent and Trademark Office*